(12) United States Patent
Tseng

(10) Patent No.: US 8,672,689 B2
(45) Date of Patent: Mar. 18, 2014

(54) ELECTRICAL CONNECTOR ASSEMBLY

(76) Inventor: Ting Chang Tseng, Taipei (TW)

(*) Notice: Subject to any disclaimer, the term of this patent is extended or adjusted under 35 U.S.C. 154(b) by 37 days.

(21) Appl. No.: 13/609,590

(22) Filed: Sep. 11, 2012

(65) Prior Publication Data

US 2013/0109245 A1    May 2, 2013

(51) Int. Cl.
*H01R 12/00* (2006.01)
(52) U.S. Cl.
USPC .............................. 439/76.1; 439/493
(58) Field of Classification Search
CPC ... H01R 12/613; H01R 12/62; H01R 13/6658
USPC .................................. 439/492, 493, 76.1
See application file for complete search history.

(56) References Cited

U.S. PATENT DOCUMENTS

| | | | |
|---|---|---|---|
| 6,695,641 B1* | 2/2004 | Lee | 439/493 |
| 6,832,931 B1* | 12/2004 | Wu | 439/499 |
| 6,948,949 B1* | 9/2005 | Schwartz et al. | 439/76.1 |
| 6,976,869 B1* | 12/2005 | Wu | 439/499 |
| 7,465,189 B2* | 12/2008 | Marcade et al. | 439/567 |
| 7,467,953 B2* | 12/2008 | Kuo et al. | 439/67 |
| 7,484,994 B2 | 2/2009 | Ko | |
| 7,553,191 B2* | 6/2009 | Su et al. | 439/637 |
| 7,563,108 B1* | 7/2009 | Wu | 439/76.1 |
| 7,585,184 B2* | 9/2009 | Su et al. | 439/579 |
| 7,607,930 B1* | 10/2009 | Wu | 439/247 |
| 7,618,282 B2 | 11/2009 | Wu et al. | |
| 7,682,162 B2* | 3/2010 | Yuan | 439/76.1 |
| 7,708,587 B2* | 5/2010 | Wu | 439/492 |
| 7,753,737 B2* | 7/2010 | Yang et al. | 439/660 |
| 7,794,273 B2* | 9/2010 | Xu et al. | 439/555 |
| 7,803,009 B2* | 9/2010 | Su et al. | 439/492 |
| 7,815,459 B2* | 10/2010 | Chen et al. | 439/351 |
| 7,938,668 B2* | 5/2011 | Chen et al. | 439/351 |
| 8,007,324 B2* | 8/2011 | Wang et al. | 439/660 |
| 8,202,127 B2* | 6/2012 | Zhang et al. | 439/660 |
| 8,342,886 B2* | 1/2013 | Zhang et al. | 439/660 |
| 8,512,071 B2* | 8/2013 | Tseng et al. | 439/493 |
| 8,523,608 B2* | 9/2013 | Fu | 439/545 |
| 2005/0101184 A1* | 5/2005 | Chang et al. | 439/564 |
| 2005/0272303 A1* | 12/2005 | Wu | 439/499 |
| 2006/0079119 A1* | 4/2006 | Wu | 439/492 |
| 2006/0094267 A1* | 5/2006 | Li | 439/76.1 |
| 2006/0110972 A1* | 5/2006 | Wu | 439/358 |
| 2006/0276083 A1* | 12/2006 | Sun | 439/638 |
| 2006/0286860 A1* | 12/2006 | Sun | 439/499 |
| 2007/0026715 A1* | 2/2007 | Huang et al. | 439/260 |
| 2007/0254496 A1* | 11/2007 | Koiwaya | 439/31 |
| 2008/0176442 A1* | 7/2008 | Kuo et al. | 439/494 |
| 2008/0188136 A1* | 8/2008 | Su et al. | 439/660 |
| 2008/0214054 A1* | 9/2008 | Su et al. | 439/637 |
| 2009/0068896 A1* | 3/2009 | Zhang | 439/626 |
| 2009/0130878 A1* | 5/2009 | Xu et al. | 439/157 |
| 2009/0215295 A1* | 8/2009 | Tseng | 439/247 |
| 2009/0301761 A1* | 12/2009 | Wu | 174/250 |

(Continued)

*Primary Examiner* — Ross Gushi
(74) *Attorney, Agent, or Firm* — Mark M. Friedman

(57) ABSTRACT

An electrical connector assembly is provided with an insulating housing, a PCB, and an FFC. The insulating housing includes a plurality of terminals and two side extensions The FFC and the terminals are electrically connected together by the PCB. A plurality of contacts of the PCB are provided on a top surface of the PCB. A space is defined by the extensions and two rearward inclined members on both sides of the insulating housing respectively with each rearward inclined member joining the insulating housing and the extension. The PCB is disposed in the space.

18 Claims, 11 Drawing Sheets

(56) References Cited

U.S. PATENT DOCUMENTS

| | | | |
|---|---|---|---|
| 2010/0009569 A1* | 1/2010 | Su et al. | 439/552 |
| 2010/0035477 A1* | 2/2010 | Yuan | 439/638 |
| 2010/0188826 A1 | 7/2010 | Yeh | |
| 2011/0076865 A1* | 3/2011 | Luo et al. | 439/82 |
| 2012/0009825 A1* | 1/2012 | Chen | 439/660 |
| 2012/0077389 A1* | 3/2012 | Zhang et al. | 439/660 |
| 2012/0100760 A1* | 4/2012 | Liu et al. | 439/660 |
| 2012/0108109 A1* | 5/2012 | Zhang et al. | 439/629 |
| 2012/0252260 A1* | 10/2012 | Tseng et al. | 439/499 |
| 2012/0282808 A1* | 11/2012 | Luo et al. | 439/607.28 |
| 2013/0065432 A1* | 3/2013 | Fu et al. | 439/569 |
| 2013/0109244 A1* | 5/2013 | Chen | 439/682 |
| 2013/0109245 A1* | 5/2013 | Tseng | 439/682 |
| 2013/0149895 A1* | 6/2013 | Fu | 439/545 |
| 2013/0217261 A1* | 8/2013 | Chen et al. | 439/499 |
| 2013/0303018 A1* | 11/2013 | Tseng et al. | 439/492 |

* cited by examiner

//ELECTRICAL CONNECTOR ASSEMBLY

BACKGROUND OF THE INVENTION

1. Field of the Invention

The invention relates to electrical connectors assembly and more particularly to a SATA (Serial Advanced Technology Attachment) connector assembly including a flex flat cable, a printed circuit board, and an insulating housing having two extensions on both sides respectively, and a space defined by at least the extensions.

2. Description of Related Art

The disclosure of Taiwan Utility Model No. M413,241 entitled "electrical connector assembly", filed Mar. 28, 2011, is incorporated herein by reference in its entirety. The electrical connector assembly comprises an insulating housing, a printed circuit board (PCB), and a flexible (or flex) flat cable (FFC). The insulating housing includes a plurality of terminals. The FFC and the terminals are electrically connected together by the PCB. The PCB is secured to the insulating housing.

However, a couple of drawbacks have been found in the electrical connector assembly. First, two extensions provided on both sides respectively are not employed as a space (i.e., being not space saving). Thus, height of the electrical connector assembly is relatively high (i.e., being not low profile). Second, a rated (i.e., maximum) current flowing through the terminals are limited. Thus, the improvement still exists.

SUMMARY OF THE INVENTION

It is therefore an object of the invention to provide an electrical connector assembly comprising an insulating housing, a printed circuit board (PCB), and a flex flat cable (FFC). The insulating housing includes a plurality of terminals and two side extensions The FFC and the terminals are electrically connected together by the PCB. A plurality of contacts of the PCB are provided on a top surface of the PCB. A space is defined by the extensions and two rearward inclined members on both sides of the insulating housing respectively with each rearward inclined member joining the insulating housing and the extension. The PCB is disposed in the space.

First advantages provided by the invention comprise a space is defined by the extensions of the insulating housing so that height of the electrical connector assembly can be greatly decrease to render a low profile electrical connector assembly, and enabling a person to correctly inspect the electrical connection of the FFC and a plurality of contacts of the PCB.

Second advantages provided by the invention comprise easy adhesive coating and inspection of the fastening of the adhesive when the adhesive is coated on one ends of the FFC with the plurality of contacts of the PCB exposed on the insulating housing, and the PCB fastened on a support plate of the insulating housing.

Third advantages provided by the invention comprise the second soldering holes of the PCB are electrically connected to the second contacts of the PCB, and the number of the second contacts is greater than that of the second soldering holes, thereby increasing a maximum current flowing through the second soldering holes.

It is a first aspect of the invention to provide an electrical connector assembly comprising an insulating housing comprising a plurality of front terminal holes, a plurality of rear holes communicating with the terminal holes respectively, a support plate extending rearward out of a rear surface, the support plate including two side pins at both sides respectively, and two extensions extending out of both sides of the support plate respectively, each extension having a vertical positioning hole; a printed circuit board (PCB) comprising a plurality of first, second, third, and fourth soldering holes, and, a plurality of first, second, third, and fourth contacts, and, and two side pin holes with the side pins fastened therein respectively; a plurality of terminals fastened in the terminal holes respectively, each terminal comprising a mating portion at one end fastened in one of the terminal holes, and a soldering portion at the other end soldered in one of the first, second, third, and fourth soldering holes, and; and a flex flat cable (FFC) comprising a plurality of conductors and an insulating layer for enclosing substantial portions of the conductors wherein an exposed portion of each conductor at one end of the FFC is electrically connected to one of the first, second, third, and fourth contacts, and; wherein the first, second, third, and fourth contacts, and are disposed on a top surface of the PCB; wherein a space is defined by the support plate, the extensions, and two rearward inclined members on both sides of the insulating housing respectively with each rearward inclined member joining the insulating housing, the support plate, and the extension; and wherein the PCB is disposed in the space.

It is a second aspect of the invention to provide an electrical connector assembly comprising a printed circuit board (PCB) comprising a plurality of first and second soldering holes and a plurality of first and second contacts wherein the first soldering holes are electrically connected to the first contacts, the second soldering holes are electrically connected to the second contacts, and the number of the second contacts is greater than that of the second soldering holes; an insulating housing comprising a plurality of front terminal holes, a plurality of rear holes communicating with the terminal holes respectively, a support plate extending rearward out of a rear surface, and two extensions extending out of both sides of the support plate respectively, each extension including a vertical positioning hole and a latch facing the latch of the other extension so that the PCB are fastened on the support plate by the latches; and a plurality of terminals fastened in the terminal holes respectively, each terminal comprising a mating portion at one end fastened in one of the terminal holes, and a soldering portion at the other end soldered in one of the first and second soldering holes; wherein the first and second contacts are disposed on a top surface of the PCB; wherein a space is defined by the support plate, the extensions, and two rearward inclined members on both sides of the insulating housing respectively with each rearward inclined member joining the insulating housing, the support plate, and the extension; and wherein the PCB is disposed in the space.

It is a third aspect of the invention to provide an electrical connector assembly comprising a printed circuit board (PCB) comprising a plurality of first and second soldering holes and a plurality of first and second contacts wherein the first soldering holes are electrically connected to the first contacts, the second soldering holes are electrically connected to the second contacts, and the number of the second contacts is greater than that of the second soldering holes; an insulating housing comprising a plurality of front terminal holes, a plurality of rear holes communicating with the terminal holes respectively, and two extensions extending out of both sides of the insulating housing respectively, each extension including a vertical positioning hole and a lower groove facing the lower groove of the other extension, both sides of the PCB being inserted into the grooves respectively to secure the PCB to the extensions; and a plurality of terminals fastened in the terminal holes respectively, each terminal comprising a mating portion at one end fastened in one of the terminal holes, and a soldering portion at the other end soldered in one of the first, second, third, and fourth soldering holes; wherein the first and second contacts are disposed on a top surface of the PCB; wherein a space is defined by the support plate, the extensions, and two rearward inclined members on both sides of the insulating housing respectively with each rearward inclined member joining the insulating housing, the support plate, and the extension; and wherein the PCB is disposed in the space.

The above and other objects, features and advantages of the invention will become apparent from the following detailed description taken with the accompanying drawings.

DETAILED DESCRIPTION OF THE INVENTION

Figure 1:
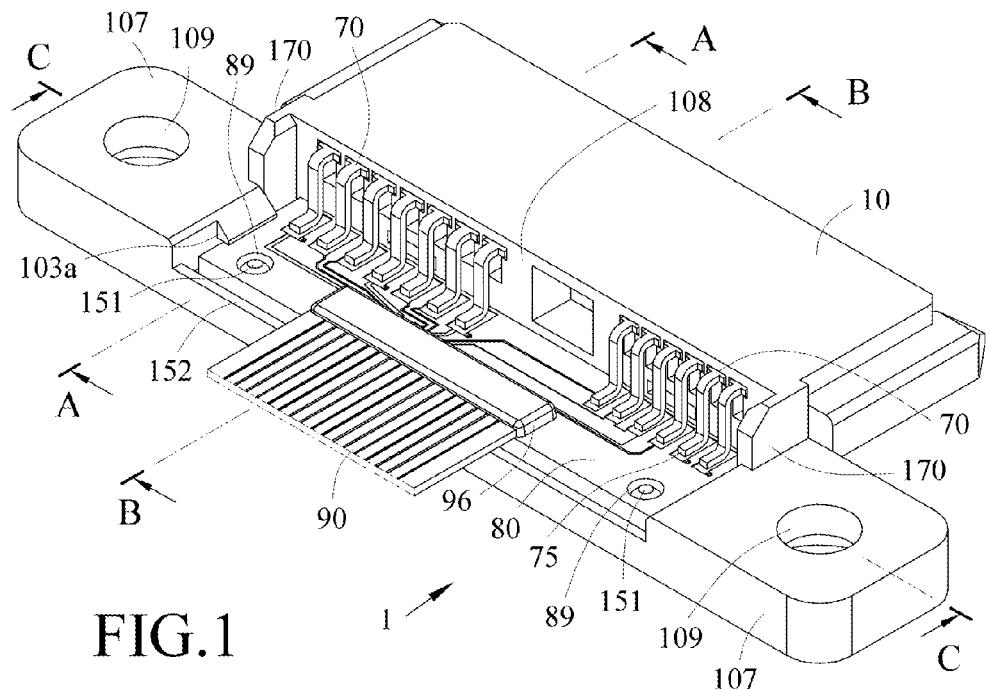
FIG. 1 is a perspective view of an electrical connector assembly according to a first preferred embodiment of the invention.
Figure 2:
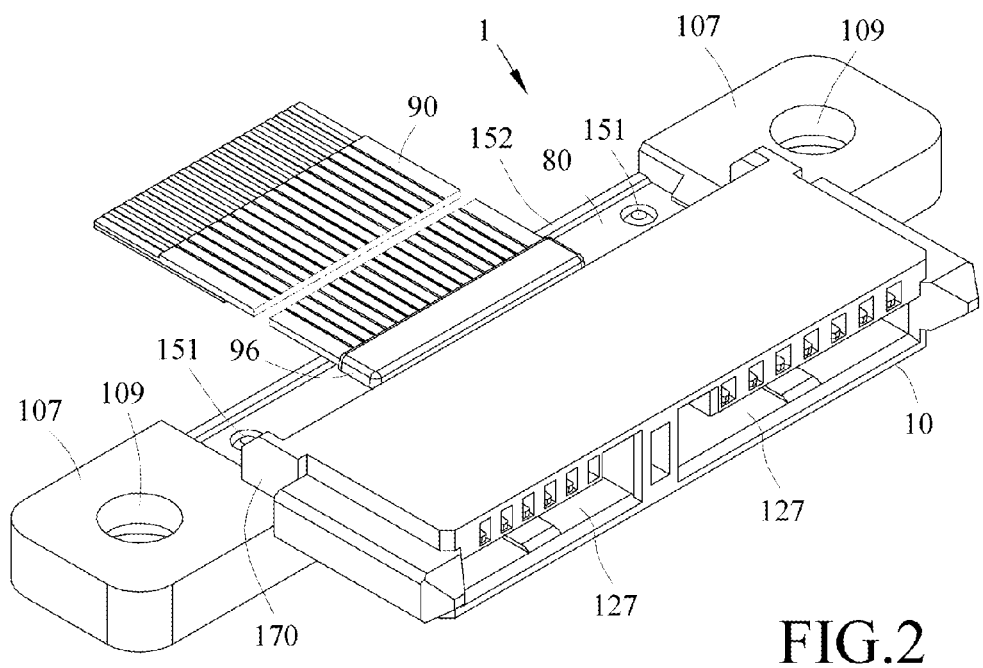
FIG. 2 is another perspective view of the electrical connector assembly shown in FIG. 1.
Figure 3:
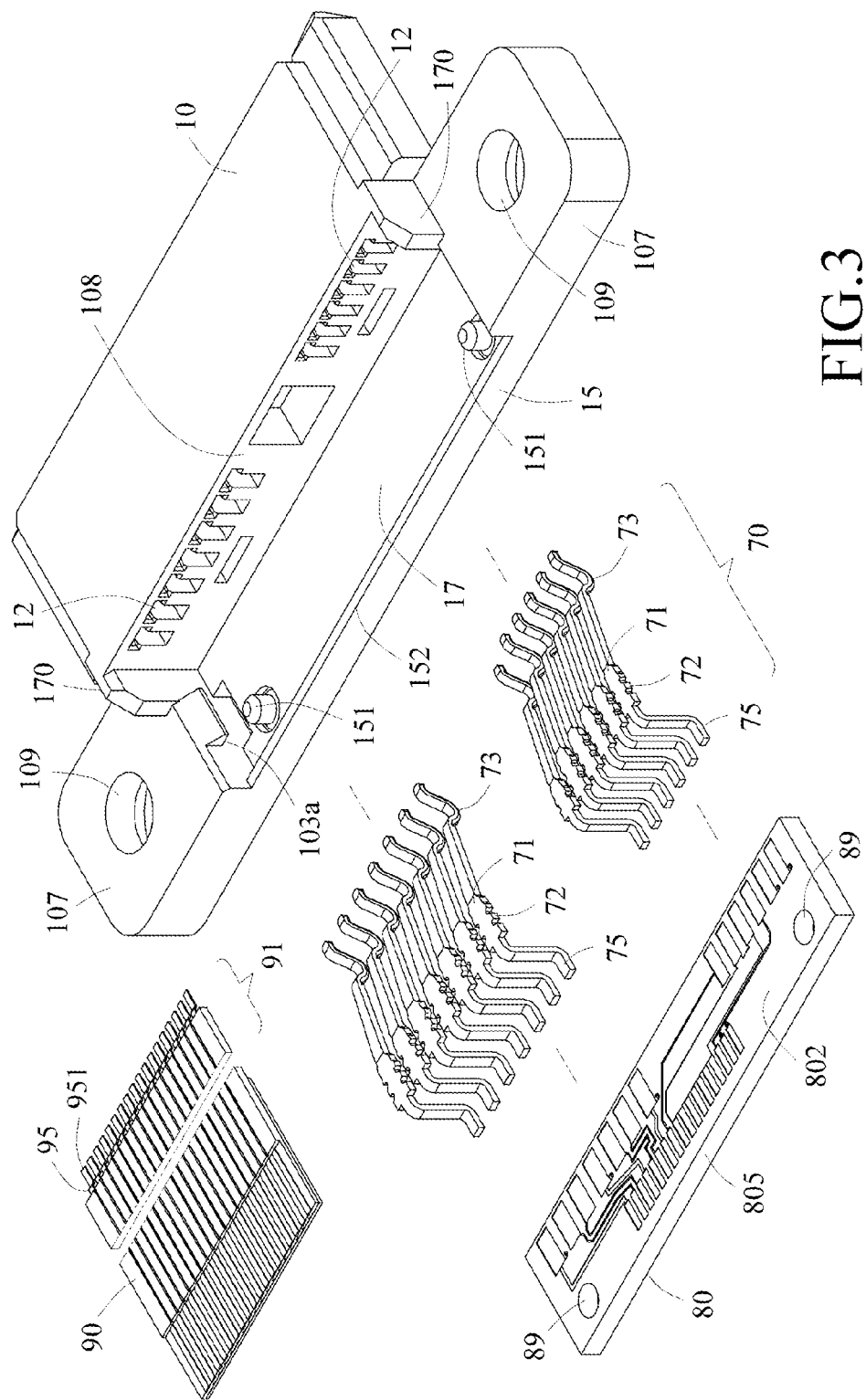
FIG. 3 is an exploded view of the electrical connector assembly of FIG. 1.

Referring to FIGS. 1 to 8, an electrical connector assembly (e.g., SATA connector) 1 in accordance with a first preferred embodiment of the invention comprises an insulating housing 10, a plurality of terminals 70, a printed circuit board (PCB) 80, and a (flex (or flexible) flat cable) FFC 90. Each component will be discussed in detail below.

The insulating housing 10 comprises a support plate 15 extending rearward out of a rear surface 108, the support plate 15 including two side pins 151 at both sides respectively, and two extensions 107 extending out of both sides of the support plate 15 respectively, each extension 107 having a vertical positioning hole 109. The PCB 80 comprises a plurality of first soldering holes 81, a plurality of second soldering holes 82, a plurality of third soldering holes 83, and a plurality of fourth soldering holes 84. The PCB 80 further comprises two side pin holes 89. In assembly, the pin holes 89 of the PCB 80 are securely put on the pins 151. The PCB 80 further comprises a plurality of first contacts 85, a plurality of second contacts 86, a plurality of third contacts 87, and a plurality of fourth contacts 88 are provided on a top surface 802.

Each terminal 70 comprises an intermediate root 71 having a plurality of projections 72 on both sides respectively, the root 71 inserted in one of a plurality of rear holes 12 in the insulating housing 10 for fastening, a bent mating portion 73 at one end, the mating portion 73 being inserted into one of a plurality of front terminal holes 127 of the insulating housing 10 for fastening, and a soldering portion 75 at the other end and soldered in one of the first, second, third, and fourth soldering holes 81, 82, 83 and 84. The terminal holes 127 communicate with the holes 12 respectively.

The FFC 90 comprises a plurality of conductors 95 and an insulating layer 901 for enclosing substantial portions of the conductors 95. Exposed portion 951 of each conductor 95 at one end 91 of the FFC 90 is electrically connected to one of the first, second, third, and fourth contacts 85, 86, 87, and 88. Adhesive 96 may be coated on one end 91 of the FFC 90 to secure the FFC 90 to the PCB 80. The adhesive may be AB adhesive, UV adhesive, hot melt type adhesive, quick dry adhesive, or any of other adhesives for fastening and protecting the FFC 90. The first, second, third, and fourth contacts 85, 86, 87, and 88 are provided on the top surface 802 of the PCB 80. A space 17 is defined by the support plate 15, the extensions 107, and two rearward inclined members 170 on both sides of the insulating housing 10 respectively in which each rearward inclined member 170 joins the insulating housing 10, the support plate 15, and the extension 107. Thus, the PCB 80 can be disposed in the space 17. As a result, a low profile of the electrical connector assembly 1 can be made possible. Further, this has the benefits of enabling a person to correctly inspect the electrical connection of the FFC 90 and the first, second, third, and fourth contacts 85, 86, 87, and 88.

Figure 4:
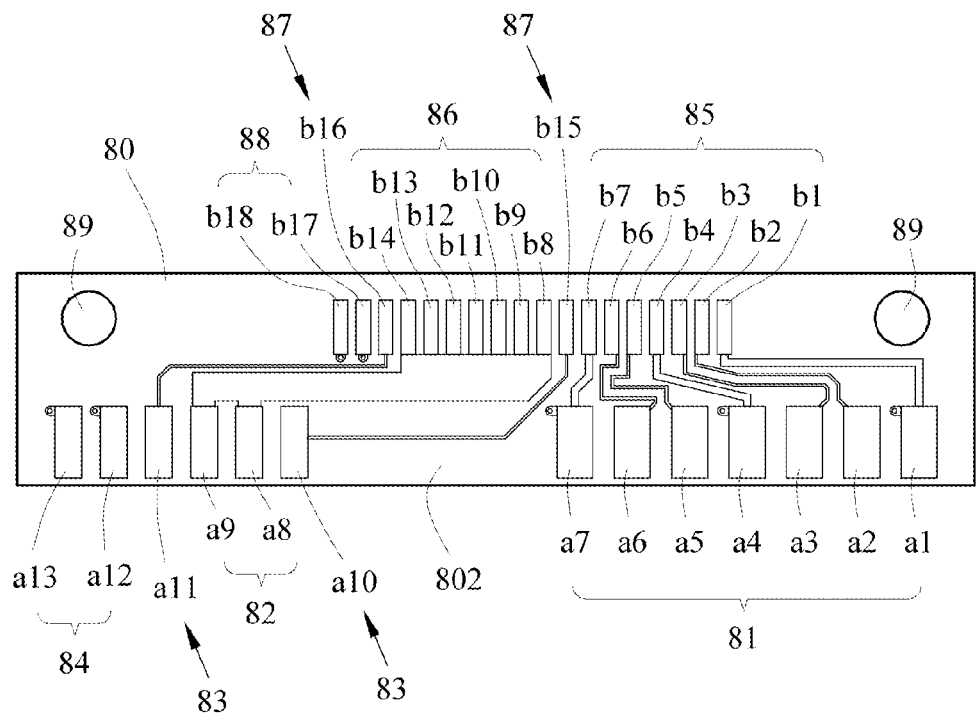
FIG. 4 is a top view of the PCB of FIG. 3.
Figure 5:
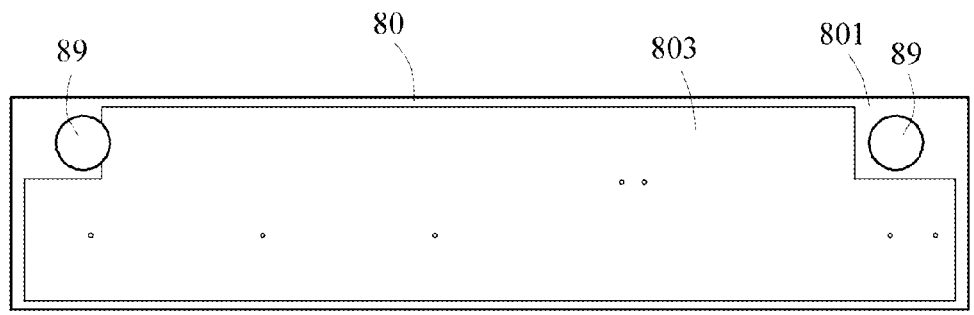
FIG. 5 is a bottom view of the PCB of FIG. 3.
Figure 6:
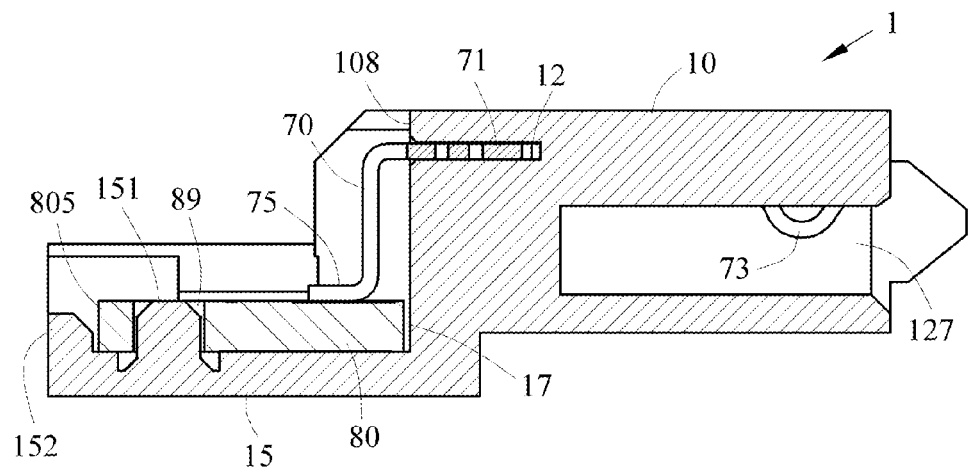
FIG. 6 is a sectional view taken along line A-A of FIG. 1.
Figure 7:
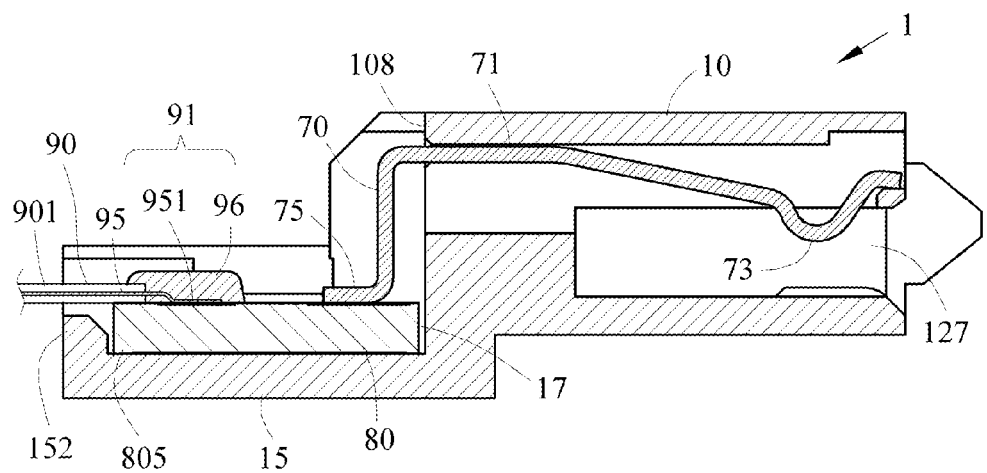
FIG. 7 is a sectional view taken along line B-B of FIG. 1.
Figure 8:
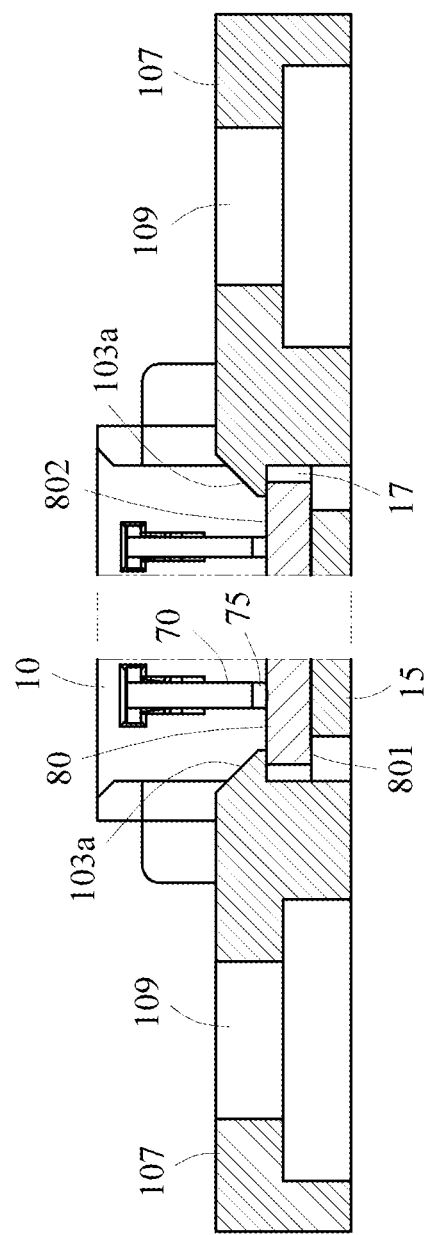
FIG. 8 is a sectional view taken along line C-C of FIG. 1.
Figure 9:
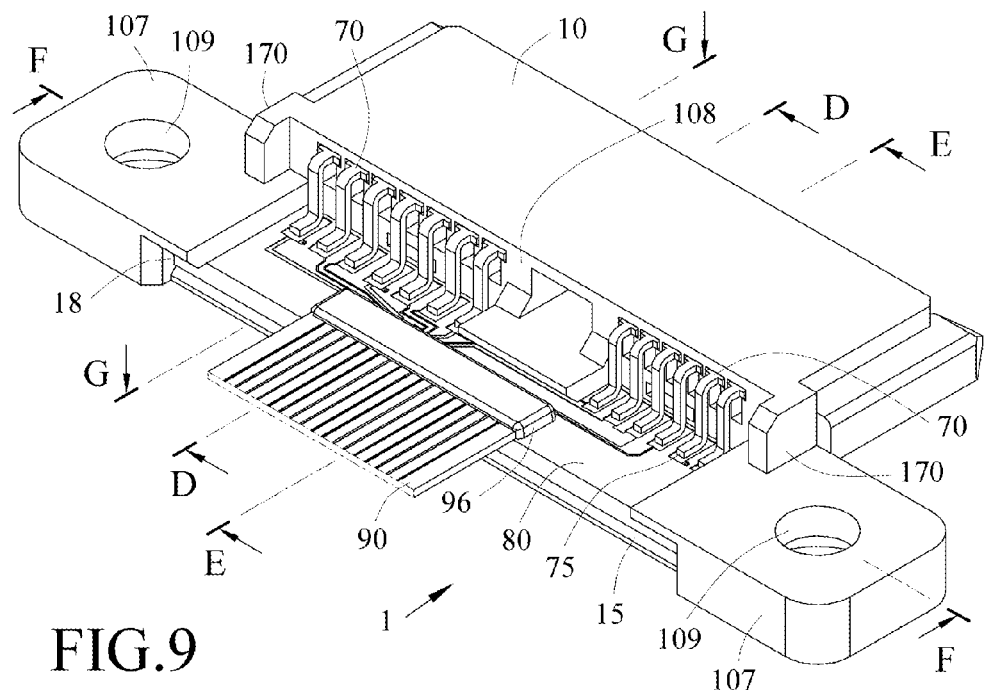
FIG. 9 is a perspective view of an electrical connector assembly according to a second preferred embodiment of the invention.
Figure 10:
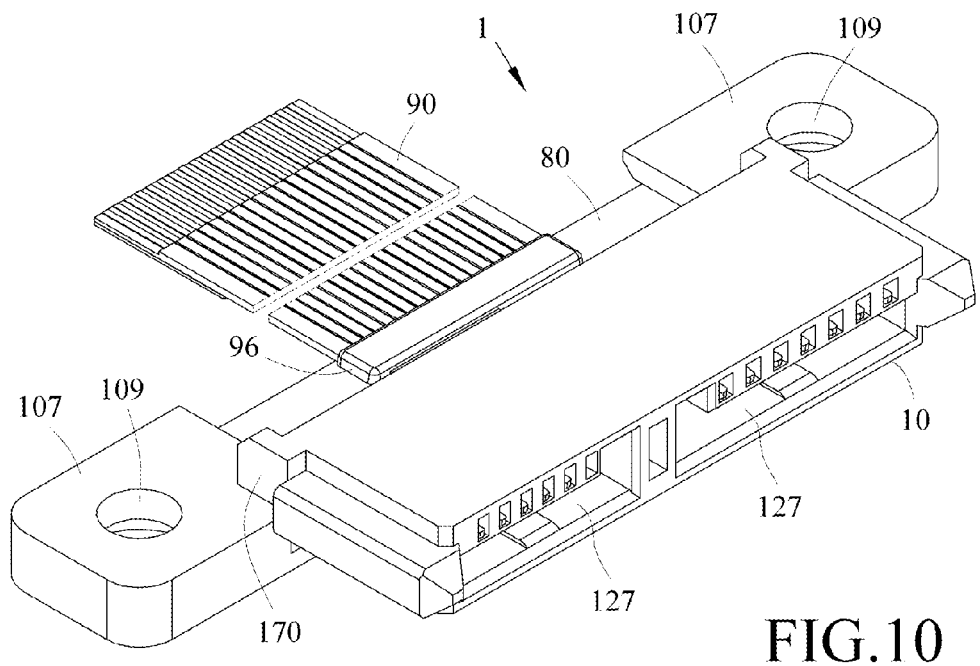
FIG. 10 is another perspective view of the electrical connector assembly shown in FIG. 9.
Figure 11:
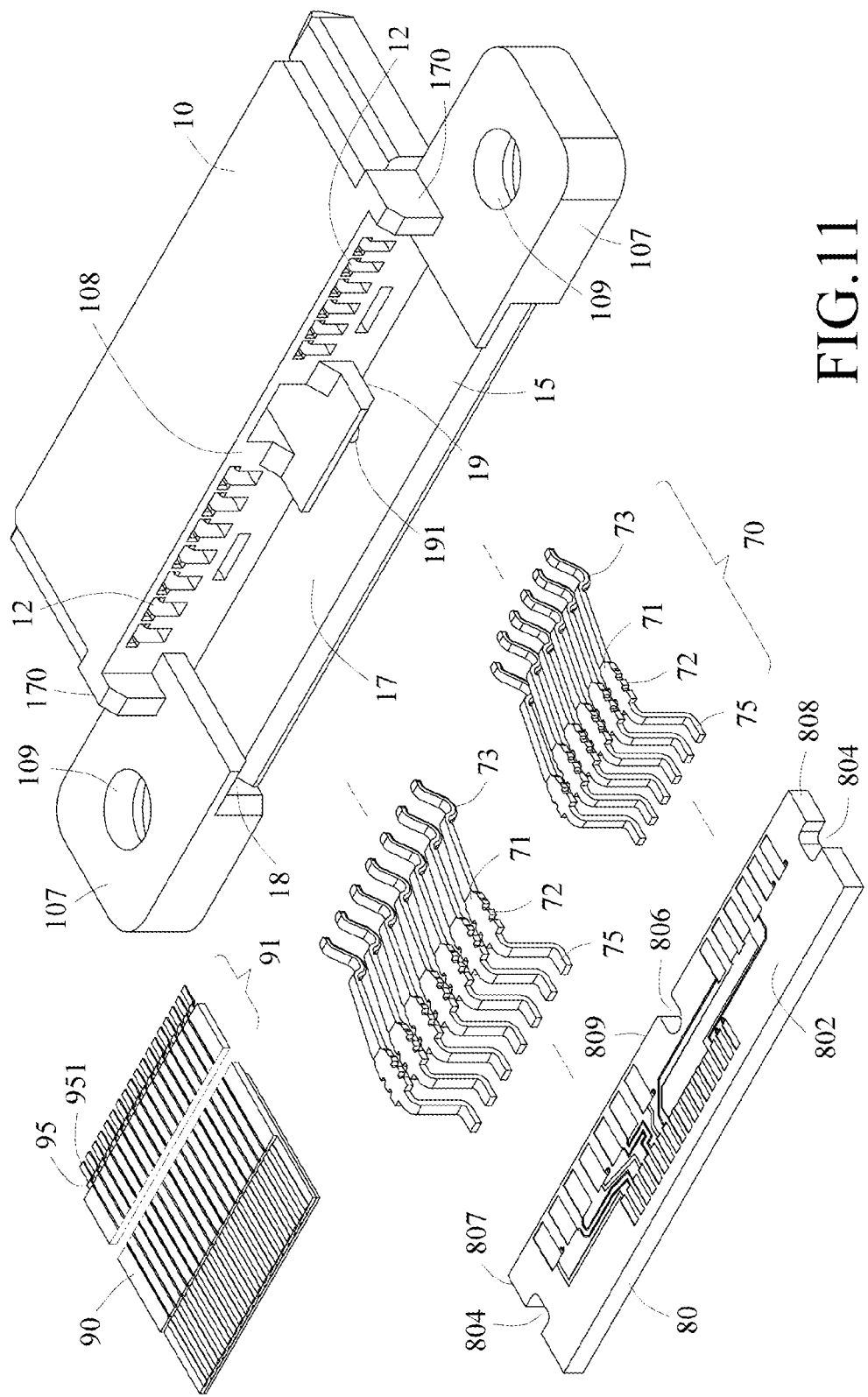
FIG. 11 is an exploded view of the electrical connector assembly of FIG. 9.
Figure 12:
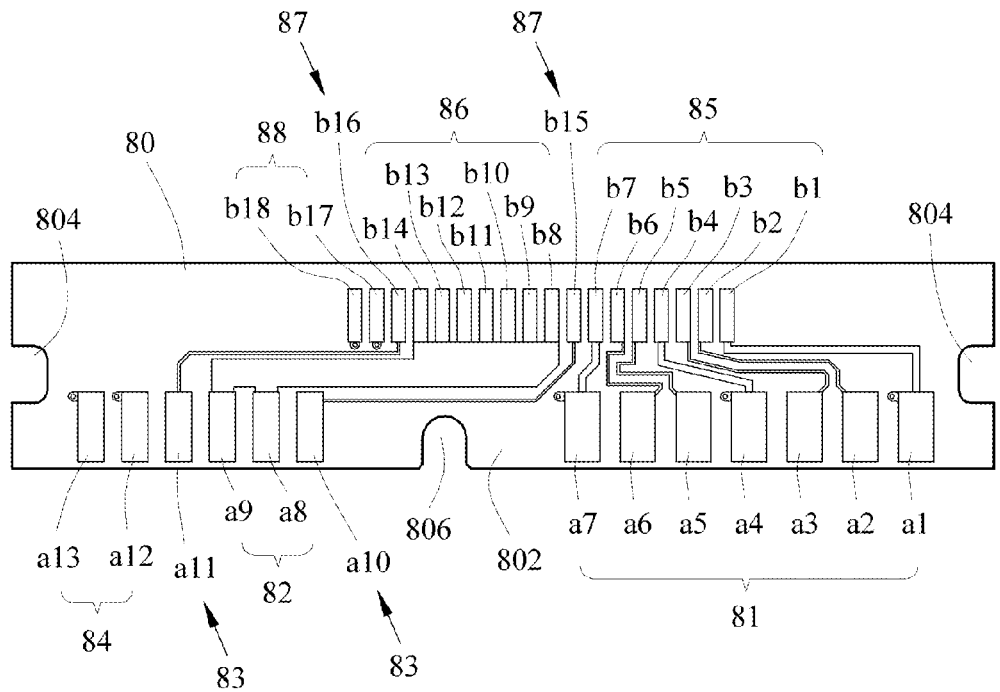
FIG. 12 is a top view of the PCB of FIG. 11.
Figure 13:
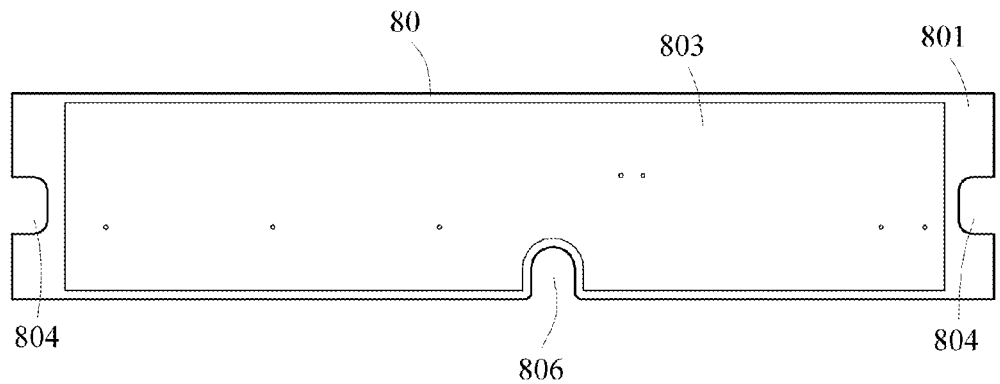
FIG. 13 is a bottom view of the PCB of FIG. 11.
Figure 14:
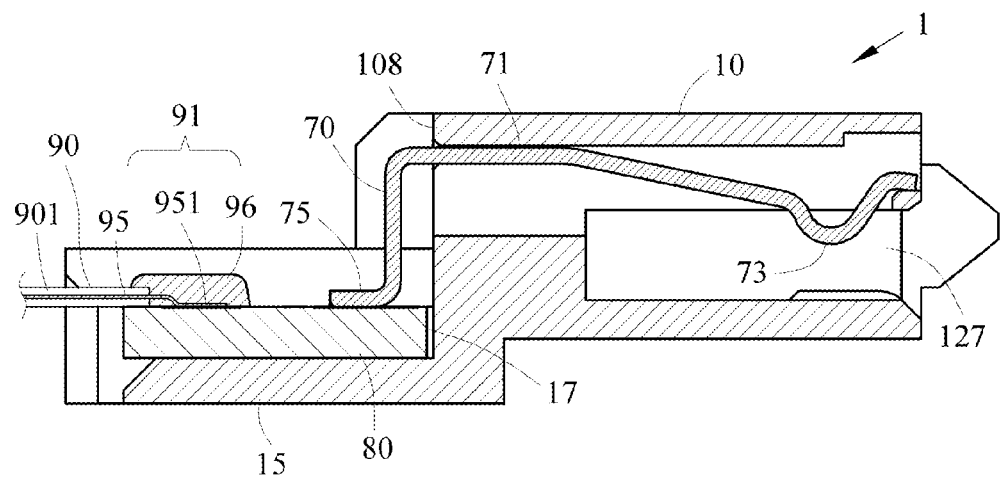
FIG. 14 is a sectional view taken along line D-D of FIG. 9.
Figure 15:
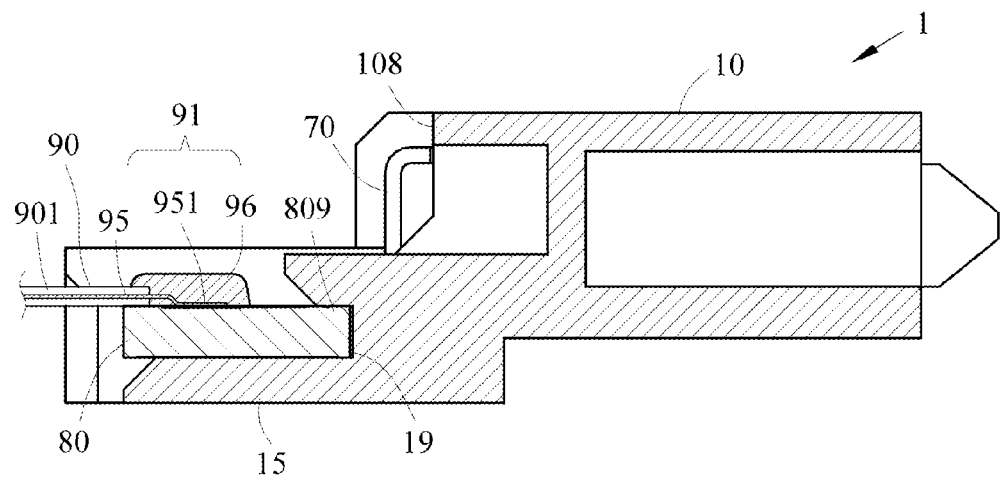
FIG. 15 is a sectional view taken along line E-E of FIG. 9.
Figure 16:
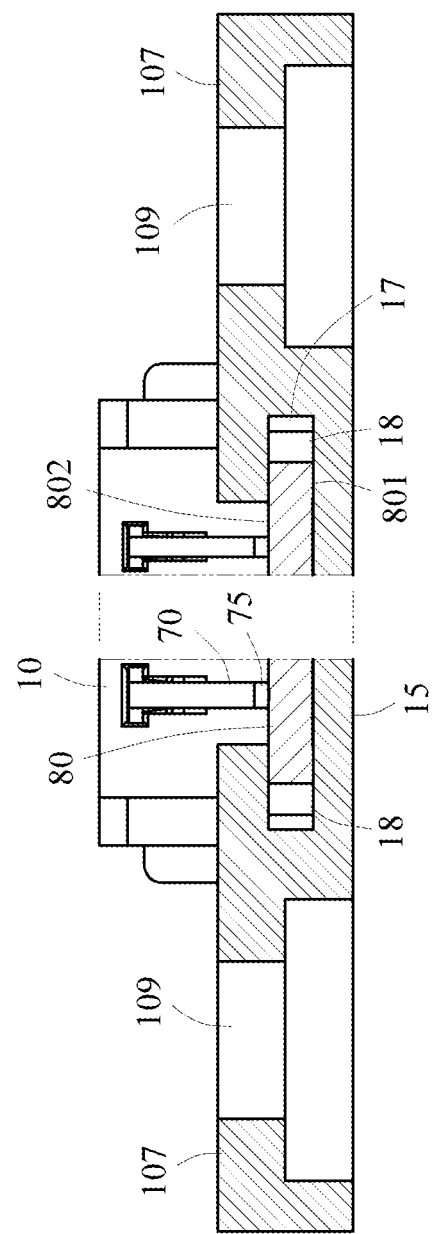
FIG. 16 is a sectional view taken along line F-F of FIG. 9.
Figure 17:
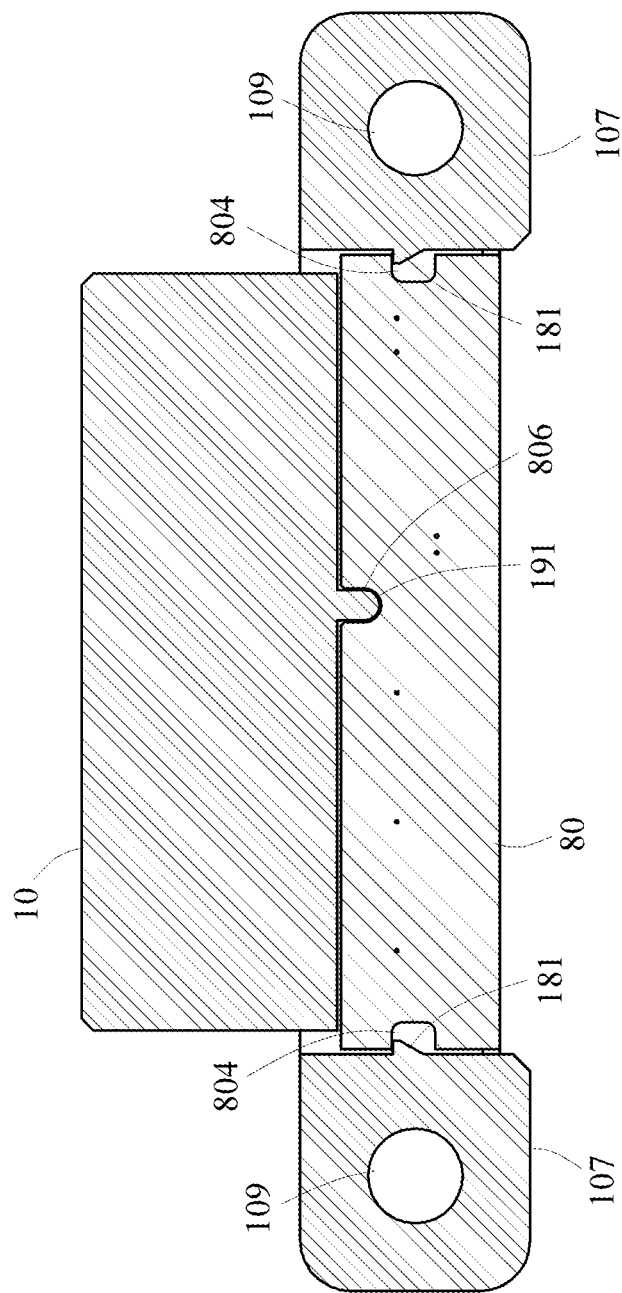
FIG. 17 is a sectional view taken along line G-G of FIG. 9.

As shown in FIGS. 4 and 5 specifically, in the first preferred embodiment, soldering holes a1, a2, a3, a4, a5, a6 and a7 of the first soldering holes 81 on the top surface 802 of the PCB 80 are electrically connected to contacts b1, b2, b3, b4, b5, b6 and b7 of the first contacts 85 respectively. A ground member 803 is provided on a bottom surface 801 of the PCB 80. Three soldering holes a1, a4 and a7 of the first soldering holes 81 are electrically connected to the ground member 803 respectively. Soldering holes a8 and a9 of the second soldering holes 82 on the top surface 802 of the PCB 80 are electrically connected to contacts b8, b9, b10, b11, b12, b13 and b14 of the second contacts 86 respectively. The number of the contacts of the second contacts 86 is greater than that of the soldering holes of the second soldering holes 82 so that a maximum current flowing through the second soldering holes 82 can be increased. Soldering holes a10 and a11 of the third soldering holes 83 on the top surface 802 of the PCB 80 are electrically connected to contacts b15 and b16 of the third contacts 87 respectively. The second contacts 82 include a plurality of contacts such as contacts a8 and a9. The second contacts 86 include at least 7 contacts such as contacts b8, b9, b10, b11, b12, b13 and b14. For example, a rated (i.e., maximum) current of each contact is 0.5 A and then a rated (i.e., maximum) current of the seven contacts is 3.5 A. A maximum current of the contacts a8, a9 is 3.5 A. Further, soldering holes of the fourth soldering holes 84 are electrically connected to the ground member 803 respectively. The fourth contacts 88 are electrically connected to the ground member 803 respectively. The fourth soldering holes 84 include a plurality of soldering holes such as soldering holes a12 and a13. The fourth contacts 88 include a plurality of contacts such as contacts b17 and b18.

As shown in FIGS. 1, 3, 6 and 8 specifically, a first configuration of the first preferred embodiment regarding the fastening of the PCB 80 and the insulating housing 10 is described in detail below. Each extension 107 further comprises a latch 103a on an edge facing the space 17 so that the PCB 80 can be clamped by the latches 103a to fasten on the support plate 15. The first, second, third, and fourth contacts 85, 86, 87, and 88 are exposed on the insulating housing 10 after coating the adhesive 96 on one end 91 of the FFC 90. Further, the PCB 80 is secured to the support plate 15. As a result, the coating of the adhesive 16 is made easy and whether the curing and fastening of the adhesive 96 is good or not can be confirmed by visually inspecting.

As shown in FIGS. 1, 3, 7 and 8 specifically, a second configuration of the first preferred embodiment regarding the fastening of the PCB 80 and the insulating housing 10 is described in detail below. The PCB 80 can be clamped by the latches 103a to fasten on the support plate 15. Alternatively, the support plate 15 comprises a rear elongated stop member 152 extending from one extension 107 to the other extension 107. Thus, the PCB 80 can be clamped by the latches 103a to fasten on the support plate 15 with a rear end 805 of the PCB 80 stopped by the elongated stop member 152.

Referring to FIGS. 9 to 16, an electrical connector assembly 1 in accordance with a second preferred embodiment of the invention is shown. The characteristics of the second preferred embodiment are substantially the same as that of the first preferred embodiment except the following:

Each extension 107 comprises a lower groove 18 on an edge facing the space 17 so that left side 807 and right side 808 of the PCB 80 can be inserted into the two grooves 18 respectively to secure the PCB 80 to the extensions 107. That is, both sides of the PCB 80 are fastened in the groove 18 with the PCB 80 securely disposed in the space 17.

As shown in FIGS. 9, 11, 16 and 17 specifically, a first configuration of the second preferred embodiment is discussed in detail below. A latching member 181 is provided in each groove 18. A recess 804 is provided on a left side 807 of the PCB 80 and a recess 804 is provided on a right side 808 thereof respectively. The latching members 181 are inserted into the recesses 804 to position the PCB 80 on the support plate 15 fastened in the space 17.

As shown in FIGS. 9, 11, 15 and 17 specifically, a second configuration of the second preferred embodiment is discussed in detail below. A trough 19 is provided on an intermediate portion of a rear surface 108 of the insulating housing 10. A portion of a front end 809 of the PCB 80 can be inserted into the trough 19 so as to secure the PCB 80 to the rear surface 108 of the insulating housing 10. Moreover, a peg 191 is provided downward on a bottom of the trough 19. A cavity 806 is provided on an intermediate portion of the front end 809 of the PCB 80. The peg 191 is inserted into the cavity 806 so as to position the PCB 80 on the support plate 15 fastened in the space 17.

While the invention has been described in terms of preferred embodiments, those skilled in the art will recognize that the invention can be practiced with modifications within the spirit and scope of the appended claims.

What is claimed is:

1. An electrical connector assembly comprising:
   an insulating housing (10) comprising a plurality of front terminal holes (127), a plurality of rear holes (12) communicating with the terminal holes (127) respectively, a support plate (15) extending rearward out of a rear surface (108), the support plate (15) including two side pins (151) at both sides respectively, and two extensions (107) extending out of both sides of the support plate (15) respectively, each extension (107) having a vertical positioning hole (109);
   a printed circuit board (PCB) (80) comprising a plurality of first, second, third, and fourth soldering holes (81, 82, 83, and 84), a plurality of first, second, third, and fourth contacts (85, 86, 87, and 88), and two side pin holes (89) with the side pins (151) fastened therein respectively;
   a plurality of terminals (70) fastened in the terminal holes (127) respectively, each terminal (70) comprising a mating portion (73) at one end fastened in one of the terminal holes (127), and a soldering portion (75) at the other end soldered in one of the first, second, third, and fourth soldering holes (81, 82, 83, and 84); and
   a flex flat cable (FFC) (90) comprising a plurality of conductors (95) and an insulating layer (901) for enclosing substantial portions of the conductors (95) wherein an exposed portion (951) of each conductor (95) at one end (91) of the FFC (90) is electrically connected to one of the first, second, third, and fourth contacts (85, 86, 87, and 88);
   wherein the first, second, third, and fourth contacts (85, 86, 87, and 88) are disposed on a top surface (802) of the PCB (80);
   wherein a space (17) is defined by the support plate (15), the extensions (107), and two rearward inclined members (170) on both sides of the insulating housing (10) respectively with each rearward inclined member (170) joining the insulating housing (10), the support plate (15), and the extension (107); and
   wherein the PCB (80) is disposed in the space (17).

2. The electrical connector assembly of claim 1, wherein each extension (107) further comprises a latch (103a) on an edge facing the space (17) for fastening the PCB (80) the support plate (15).

3. The electrical connector assembly of claim 2, wherein the first soldering holes (81) of the first, second, third, and fourth soldering holes (81, 82, 83, and 84) are electrically connected to the first contacts (85) of the first, second, third, and fourth contacts (85, 86, 87, and 88), the second soldering holes (82) of the first, second, third, and fourth soldering holes (81, 82, 83, and 84) are electrically connected to the second contacts (86) of the first, second, third, and fourth contacts (85, 86, 87, and 88), and the number of the second contacts (86) is greater than that of the second soldering holes (82).

4. The electrical connector assembly of claim 3, wherein the PCB (80) further comprises a ground member (803) disposed on a bottom surface (801), at least three soldering holes (a1, a4, and a7) of the first soldering holes (81) are electrically connected to the ground member (803) respectively, the second soldering holes (82) comprises a plurality of soldering holes (a8 and a9), and the second contacts (86) comprises at least seven contacts (b8, b9, b10, b11, b12, b13, and b14).

5. The electrical connector assembly of claim 3, wherein the PCB (80) further comprises a ground member (803) disposed on a bottom surface (801), the third soldering holes (83) of the first, second, third, and fourth soldering holes (81, 82, 83, and 84) are electrically connected to the third contacts (87) of the first, second, third, and fourth contacts (85, 86, 87, and 88), the fourth soldering holes (84) of the first, second, third, and fourth soldering holes (81, 82, 83, and 84) are electrically connected to the ground member (803), and the fourth contacts (88) of the first, second, third, and fourth contacts (85, 86, 87, and 88) are electrically connected to the ground member (803).

6. The electrical connector assembly of claim 1, further comprising an adhesive (96) coated on one ends (91) of the FFC (90) to secure the FFC (90) to the PCB (80), wherein the adhesive (96) is AB adhesive, UV adhesive, hot melt type adhesive, quick dry adhesive, or any of other adhesives for fastening and protecting the FFC (90).

7. An electrical connector assembly comprising:
   a printed circuit board (PCB) (80) comprising a plurality of first and second soldering holes (81 and 82) and a plurality of first and second contacts (85 and 86) wherein the first soldering holes (81) are electrically connected to the first contacts (85), the second soldering holes (82) are electrically connected to the second contacts (86), and the number of the second contacts (86) is greater than that of the second soldering holes (82);

an insulating housing (10) comprising a plurality of front terminal holes (127), a plurality of rear holes (12) communicating with the terminal holes (127) respectively, a support plate (15) extending rearward out of a rear surface (108), and two extensions (107) extending out of both sides of the support plate (15) respectively, each extension (107) including a vertical positioning hole (109) and a latch (103*a*) facing the latch (103*a*) of the other extension (107) so that the PCB (80) are fastened on the support plate (15) by the latches (103*a*); and a plurality of terminals (70) fastened in the terminal holes (127) respectively, each terminal (70) comprising a mating portion (73) at one end fastened in one of the terminal holes (127), and a soldering portion (75) at the other end soldered in one of the first and second soldering holes (81 and 82);

wherein the first and second contacts (85 and 86) are disposed on a top surface (802) of the PCB (80);

wherein a space (17) is defined by the support plate (15), the extensions (107), and two rearward inclined members (170) on both sides of the insulating housing (10) respectively with each rearward inclined member (170) joining the insulating housing (10), the support plate (15), and the extension (107); and wherein the PCB (80) is disposed in the space (17).

8. The electrical connector assembly of claim 7, wherein the support plate (15) comprises a rear elongated stop member (152) extending from one extension (107) to the other extension (107) so that the PCB (80) is fastened on the support plate (15) by frictionally engaging the elongated stop member (152) with a rear end (805) of the PCB (80).

9. The electrical connector assembly of claim 7, the PCB (80) further comprises a plurality of third soldering holes (83) and a plurality of third contacts (87), the third soldering holes (83) being electrically connected to the third contacts (87).

10. The electrical connector assembly of claim 9, further comprising a flex flat cable (FFC) (90) including a plurality of conductors (95), wherein exposed portion (951) at one end (91) of each conductor (95) is electrically connected to one of the first, second, and third contacts (85, 86, and 87), and further comprising an adhesive (96) coated on one ends (91) of the FFC (90) to secure the FFC (90) to the PCB (80).

11. An electrical connector assembly comprising:

a printed circuit board (PCB) (80) comprising a plurality of first and second soldering holes (81 and 82) and a plurality of first and second contacts (85 and 86) wherein the first soldering holes (81) are electrically connected to the first contacts (85), the second soldering holes (82) are electrically connected to the second contacts (86), and the number of the second contacts (86) is greater than that of the second soldering holes (82);

an insulating housing (10) comprising a plurality of front terminal holes (127), a plurality of rear holes (12) communicating with the terminal holes (127) respectively, and two extensions (107) extending out of both sides of the insulating housing (10) respectively, each extension (107) including a vertical positioning hole (109) and a lower groove (18) facing the lower groove (18) of the other extension (107), both sides (807 and 808) of the PCB (80) being inserted into the grooves (18) respectively to secure the PCB (80) to the extensions (107); and a plurality of terminals (70) fastened in the terminal holes (127) respectively, each terminal (70) comprising a mating portion (73) at one end fastened in one of the terminal holes (127), and a soldering portion (75) at the other end soldered in one of the first, second, third, and fourth soldering holes (81 and 82);

wherein the first and second contacts (85 and 86) are disposed on a top surface (802) of the PCB (80);

wherein a space (17) is defined by the support plate (15), the extensions (107), and two rearward inclined members (170) on both sides of the insulating housing (10) respectively with each rearward inclined member (170) joining the insulating housing (10), the support plate (15), and the extension (107); and wherein the PCB (80) is disposed in the space (17).

12. The electrical connector assembly of claim 11, wherein each groove (18) comprises a latching member (181), the PCB (80) further comprises two recesses (804) on both sides (807 and 808) respectively, and the latching members (181) are inserted into the recesses (804) to position the PCB (80) in the space (17).

13. The electrical connector assembly of claim 11, further comprising a trough (19) disposed on an intermediate portion of a rear surface (108) of the insulating housing (10), wherein a portion of a front end (809) of the PCB (80) is inserted into the trough (19) so as to secure the PCB (80) to the rear surface (108) of the insulating housing (10).

14. The electrical connector assembly of claim 13, further comprising a support plate (15) extending rearward out of the rear surface (108) of the insulating housing (10), a peg (191) extending downward out of a bottom of the trough (19), and a cavity (806) disposed on an intermediate portion of the front end (809) of the PCB (80), wherein the peg (191) is inserted into the cavity (806) so as to position the PCB (80) on the support plate (15).

15. The electrical connector assembly of claim 11, wherein the PCB (80) further comprises a plurality of third soldering holes (83) and a plurality of third contacts (87), the third soldering holes (83) being electrically connected to the third contacts (87).

16. The electrical connector assembly of claim 15, further comprising a flex flat cable (FFC) (90) including a plurality of conductors (95), wherein exposed portion (951) at one end (91) of each conductor (95) is electrically connected to one of the first, second, and third contacts (85, 86, and 87), and further comprising an adhesive (96) coated on one ends (91) of the FFC (90) to secure the FFC (90) to the PCB (80).

17. The electrical connector assembly of claim 15, wherein the PCB (80) further comprises a ground member (803) disposed on a bottom surface (801), a plurality of fourth soldering holes (84), and a plurality of fourth contacts (88) wherein the fourth soldering holes (84) and the fourth contacts (88) are electrically connected to the ground member (803).

18. The electrical connector assembly of claim 11, wherein the PCB (80) further comprises a ground member (803) disposed on a bottom surface (801), at least three soldering holes (a1, a4, and a7) of the first soldering holes (81) are electrically connected to the ground member (803) respectively, the second soldering holes (82) comprises a plurality of soldering holes (a8 and a9), and the second contacts (86) comprises at least seven contacts (b8, b9, b10, b11, b12, b13, and b14).

* * * * *